(12) United States Patent
Iwaki et al.

(10) Patent No.: US 11,573,251 B2
(45) Date of Patent: Feb. 7, 2023

(54) SEMICONDUCTOR SAMPLE INSPECTION DEVICE AND INSPECTION METHOD

(71) Applicant: HAMAMATSU PHOTONICS K.K., Hamamatsu (JP)

(72) Inventors: Yoshitaka Iwaki, Fujisawa (JP); Yuji Nakajima, Hamamatsu (JP); Toshiki Yamada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/271,042

(22) PCT Filed: Jun. 5, 2019

(86) PCT No.: PCT/JP2019/022423
§ 371 (c)(1),
(2) Date: Feb. 24, 2021

(87) PCT Pub. No.: WO2020/044707
PCT Pub. Date: Mar. 5, 2020

(65) Prior Publication Data
US 2021/0325435 A1 Oct. 21, 2021

(30) Foreign Application Priority Data
Aug. 30, 2018 (JP) .............................. JP2018-161829

(51) Int. Cl.
*G01R 19/00* (2006.01)
*G01R 31/26* (2020.01)
(Continued)

(52) U.S. Cl.
CPC ..... *G01R 19/0053* (2013.01); *G01R 31/2601* (2013.01); *G01R 31/2656* (2013.01); *G01R 31/311* (2013.01)

(58) Field of Classification Search
CPC ............ G01R 19/0053; G01R 31/2601; G01R 31/2656; G01R 31/311; G01N 21/95
(Continued)

(56) References Cited

U.S. PATENT DOCUMENTS 4,588,950 A  5/1986 Henley
6,169,408 B1  1/2001 Kantor et al.
(Continued)

FOREIGN PATENT DOCUMENTS

JP  H05-045293 A  2/1993
JP  H6-300824 A  10/1994
(Continued)

OTHER PUBLICATIONS

Espacenet English translation KR101515719B1 Probe Station (Year: 2015).*
Espacenet English translation JP2012242157A (Year: 2012).*
International Preliminary Report on Patentability dated Mar. 11, 2021 for PCT/JP2019/022423.

*Primary Examiner* — Jermele M Hollington
*Assistant Examiner* — Courtney G McDonnough
(74) *Attorney, Agent, or Firm* — Faegre Drinker Biddle & Reath LLP

(57) ABSTRACT

An inspection device includes a reference signal output section, a noise removal section, and an electrical characteristic measurement section. The reference signal output section is connected to an external power supply device in electrical parallel with a semiconductor sample, and outputs a reference signal according to the output of the external power supply device. The noise removal section outputs a noise removal signal obtained by removing a noise component of the output of the external power supply device from the current signal output from the semiconductor sample based on the reference signal. The electrical characteristic measurement section measures the electrical characteristic
(Continued)

of the semiconductor sample based on the noise removal signal. The inspection device measures the electrical characteristic of the semiconductor sample to which a voltage is being applied by the external power supply device and which is being irradiated and scanned with light. The inspection device outputs a defective portion of the semiconductor sample based on the electrical characteristic.

12 Claims, 10 Drawing Sheets

(51) Int. Cl.
 *G01R 31/265* (2006.01)
 *G01R 31/311* (2006.01)
(58) Field of Classification Search
 USPC .................................................... 324/762.01
 See application file for complete search history.

(56) References Cited

U.S. PATENT DOCUMENTS

| 2002/0163352 A1* | 11/2002 | Falk ................... G01R 31/3163 |
| | | 324/754.22 |
| 2005/0073328 A1 | 4/2005 | Huang et al. |
| 2015/0253241 A1 | 9/2015 | Kaneoka |

FOREIGN PATENT DOCUMENTS

| JP | H8-255818 A | | 10/1996 | | |
| JP | H11-271363 A | | 10/1999 | | |
| JP | 2000-131344 A | | 5/2000 | | |
| JP | 2002-139539 A | | 5/2002 | | |
| JP | 2004-264030 A | | 9/2004 | | |
| JP | 2012-242157 A | | 12/2012 | | |
| JP | 2012242157 A | * | 12/2012 | ........... | G01R 31/302 |
| JP | 2014-092514 A | | 5/2014 | | |
| KR | 101515719 B1 | * | 4/2015 | ........... | G01R 1/0408 |
| TW | 200922086 A | | 5/2009 | | |

\* cited by examiner

SEMICONDUCTOR SAMPLE INSPECTION DEVICE AND INSPECTION METHOD

TECHNICAL FIELD

The present invention relates to an inspection device for a semiconductor sample and an inspection method for a semiconductor sample.

BACKGROUND ART

A known inspection device for a semiconductor sample inspects a defective portion of a semiconductor sample using an optical beam induced resistance change (OBIRCH) method (for example, Patent Literature 1). The inspection device applies a voltage to the semiconductor sample, and measures the electrical characteristic of the semiconductor sample in response to laser beam irradiation and scanning based on the current signal output from the semiconductor sample. The inspection device inspects a defective portion of the semiconductor sample based on the measured electrical characteristic.

CITATION LIST

Patent Literature

Patent Literature 1: Japanese Unexamined Patent Publication No. H6-300824

SUMMARY OF INVENTION

Technical Problem

In the inspection device using the OBIRCH method, improving the strength of the current signal output from the semiconductor sample increases the amount of change in the electrical characteristic of the semiconductor sample in response to laser beam irradiation and scanning. As the amount of change in the electrical characteristic increases, the inspection accuracy of the defective portion of the semiconductor sample also improves. For this reason, it is required to increase the electric power supplied to the semiconductor sample. However, the inspection device using the OBIRCH method requires electric power for various functions, such as laser beam irradiation and scanning, an operation of a microscope unit, and image processing on a measurement result. For this reason, electric power supplied to the semiconductor sample is limited.

In order to increase the electric power supplied to a semiconductor sample, it is conceivable to supply electric power to the semiconductor sample from an external power supply device instead of an internal power supply of the inspection device. However, when the external power supply device is used, normal mode noise (for example, switching noise) caused by the external power supply device may be mixed into the current signal output from the semiconductor sample. If noise is mixed into the current signal output from the semiconductor sample, the noise also affects the measurement result of the electrical characteristic of the semiconductor sample. For this reason, even if the electric power supplied to the semiconductor sample is increased by the external power supply device, the inspection accuracy of a defective portion of the semiconductor sample may be lowered due to the influence of noise.

One aspect of the present invention is to provide an inspection device for a semiconductor sample, capable of improving the inspection accuracy of a defective portion of a semiconductor sample. Another aspect of the present invention is to provide an inspection method for a semiconductor sample, capable of improving the inspection accuracy of a defective portion of a semiconductor sample.

Solution to Problem

An inspection device for a semiconductor sample according to one aspect of the present invention includes a reference signal output section, a noise removal section, and an electrical characteristic measurement section. The reference signal output section is connected to an external power supply device in electrical parallel with the semiconductor sample. The reference signal output section is configured to output a reference signal according to an output of the external power supply device. The noise removal section is configured to output, based on the reference signal, a noise removal signal obtained by removing a noise component of the output of the external power supply device from a current signal. The current signal is output from the semiconductor sample in response to application of a voltage from the external power supply device. The electrical characteristic measurement section is configured to measure an electrical characteristic of the semiconductor sample based on the noise removal signal. The inspection device measures the electrical characteristic of the semiconductor sample to which a voltage is being applied by the external power supply device and which is being irradiated and scanned with light, and outputs a defective portion of the semiconductor sample based on the electrical characteristic.

In the one aspect described above, the inspection device includes the reference signal output section connected to the external power supply device in electrical parallel with the semiconductor sample and configured to output a reference signal according to the output of the external power supply device. The noise removal section is configured to output, based on the reference signal, a noise removal signal obtained by removing the noise of the output of the external power supply device from a test signal indicating a current signal output from the semiconductor sample in reference to application of a voltage from the external power supply device. The electrical characteristic measurement section measures the electrical characteristic of the semiconductor sample based on the noise removal signal. Therefore, the inspection device described above can both increase the electric power supplied to the semiconductor sample by using the external power supply device and reduce the influence of noise on the measurement result of the electrical characteristic of the semiconductor sample. As a result, the inspection accuracy of a defective portion of the semiconductor sample can be improved.

In the one aspect described above, the reference signal output section may be connected in electrical series to a reference member connected to the external power supply device in electrical parallel with the semiconductor sample. The reference signal output section may be configured to output, as the reference signal, a signal based on a current signal output from the reference member in response to application of a voltage from the external power supply device. In this case, the reference signal output from the reference signal output section is based on the current signal from the reference member that is connected to the external power supply device in electrical parallel with the semiconductor sample. Therefore, it is easy to adjust the gain of the reference signal according to the current signal output from the semiconductor sample.

In the one aspect described above, the reference signal output section may be configured to output, as the reference signal, a signal obtained by removing a DC current component from a current signal output from the external power supply device. In this case, the reference signal output from the reference signal output section is based on a signal obtained by removing the DC current component from the current signal output from the external power supply device. The signal obtained by removing the DC current component indicates a noise component of the output of the external power supply device. Therefore, it is easy to generate a reference signal including a noise component of the output of the external power supply device.

In the one aspect described above, a capacitor that is connected to the external power supply device in electrical parallel with the semiconductor sample and is connected in electrical series to the reference signal output section may be further provided. In this case, since the capacitor is connected to the external power supply device in electrical parallel with the semiconductor sample, the current value output from the external power supply device is a current value output from the semiconductor sample. As a result, the ease of measuring the electrical characteristic is improved.

In the one aspect described above, a test signal output section configured to output a test signal obtained by converting the current signal output from the semiconductor sample into a voltage signal may be provided. The reference signal output section may be configured to output, as the reference signal, a signal obtained by converting a current signal from the external power supply device into a voltage signal. The noise removal section may be configured to output, as the noise removal signal, a signal indicating a difference between the test signal and the reference signal. In this case, the test signal and the reference signal are obtained by converting the current signal into the voltage signal in each of the test signal generation section and the reference signal output section. Therefore, in the noise removal signal indicating the difference between the test signal and the reference signal, noise generated when the current signal is converted into the voltage signal is also removed.

In the one aspect described above, the reference signal output section may be configured to output, as the reference signal, a signal indicating a phase opposite to that of a current signal according to the output of the external power supply device. The noise removal section may include an addition section and an amplification section. The addition section may be configured to add the reference signal to the current signal output from the semiconductor sample. The amplification section may be configured to amplify a signal obtained by the addition of the addition section. In this case, the amplification is performed after adding the reference signal to the current signal output from the semiconductor sample. That is, amplification is performed after the noise of the output of the external power supply device is removed. Therefore, even when the noise of the output of the external power supply device is large, it is possible to prevent the noise from being removed from the reference signal due to saturation caused by amplification. Therefore, the noise of the output of the external power supply device is removed more accurately.

In the one aspect described above, the noise removal section and the electrical characteristic measurement section may be electrically insulated from each other and are connected to each other through a transformer, a photocoupler, or a relay. In this case, it is possible to prevent common mode noise from being mixed into the electrical characteristic measurement section.

In the one aspect described above, at least one of the reference signal output section and the noise removal section may be configured to operate with electric power supplied from a floating circuit connected to a ground of the external power supply device. In this case, the mixing of common mode noise from the power supply that supplies electric power to the reference signal output section or the noise removal section is suppressed.

In an inspection method for a semiconductor sample according to another aspect of the present invention, a voltage is applied to the semiconductor sample by an external power supply device. The semiconductor sample to which a voltage is being applied by the external power supply device is irradiated and scanned with light. A test signal based on a current signal output from the semiconductor sample in response to application of a voltage from the external power supply device is acquired. A reference signal output according to an output of the external power supply device is acquired from a reference signal output section connected to the external power supply device in electrical parallel with the semiconductor sample. A noise removal signal is generated by removing noise of the output of the external power supply device from the test signal based on the reference signal. An electrical characteristic of the semiconductor sample are measured based on the noise removal signal. A defective portion of the semiconductor sample is output based on the electrical characteristic of the semiconductor sample.

In another aspect described above, the reference signal according to the output of the external power supply device is acquired from the reference signal output section connected to the external power supply device in electrical parallel with the semiconductor sample. Based on the reference signal, noise of the output of the external power supply device is removed from the test signal. The electrical characteristic of the semiconductor sample are measured based on the noise removal signal obtained by removing noise from the test signal. Therefore, the inspection device described above can both increase the electric power supplied to the semiconductor sample by using the external power supply device and reduce the influence of noise on the measurement result of the electrical characteristic of the semiconductor sample. As a result, the inspection accuracy of a defective portion of the semiconductor sample can be improved.

In another aspect described above, a reference member may be connected to the external power supply device in electrical parallel with the semiconductor sample and connected in electrical series to the reference signal output section. The reference signal may be a signal based on a current signal output from the reference member in response to application of a voltage from the external power supply device. In this case, the reference signal is based on the current signal from the reference member that is connected to the external power supply device in electrical parallel with the semiconductor sample. Therefore, it is easy to adjust the gain of the reference signal according to the current signal output from the semiconductor sample.

In another aspect described above, the reference signal may be a signal output from the reference signal output section based on a signal obtained by removing a DC current component from a current signal output from the external power supply device. In this case, the reference signal is based on a signal obtained by removing the DC current component from the current signal output from the external power supply device. The signal obtained by removing the DC current component indicates a noise component of the output of the external power supply device. Therefore, it is easy to generate a reference signal including a noise component of the output of the external power supply device.

In another aspect described above, a capacitor may be connected to the external power supply device in electrical parallel with the semiconductor sample and connected in electrical series to the reference signal output section. A signal may be generated by removing a DC current component from the current signal output from the external power supply device by the capacitor. In this case, since the capacitor is connected to the external power supply device in electrical parallel with the semiconductor sample, the current value output from the external power supply device is a current value output from the semiconductor sample. As a result, the ease of measuring the electrical characteristic is improved.

In another aspect described above, the test signal may be a voltage signal obtained by converting a current signal output from the semiconductor sample in response to application of a voltage from the external power supply device. The reference signal may be a voltage signal according to the output of the external power supply device. The noise removal signal may be a signal based on a difference between the test signal and the reference signal. In this case, each of the test signal and the reference signal is obtained by converting the current signal into a voltage signal. Since noise is removed by the difference between the test signal and the reference signal, noise generated when converting the current signal into the voltage signal is also removed.

In another aspect described above, the noise removal signal may be amplified. The test signal may be a current signal output from the semiconductor sample in response to application of a voltage from the external power supply device. The reference signal may be a signal indicating a phase opposite to that of a current signal according to the output of the external power supply device. The noise removal signal may be a signal obtained by adding the test signal and the reference signal. In this case, amplification is performed after adding the reference signal to the current signal output from the semiconductor sample and removing noise. Therefore, even when the noise of the output of the external power supply device is large, it is possible to prevent the noise from being removed from the reference signal due to saturation caused by amplification. Therefore, the noise of the output of the external power supply device is removed more accurately.

Advantageous Effects of Invention

One aspect of the present invention provides an inspection device for a semiconductor sample, capable of improving the ease of detecting a defective portion of a semiconductor sample. Another aspect of the present invention provides an inspection method for a semiconductor sample, capable of improving the inspection accuracy of a defective portion of a semiconductor sample.

DESCRIPTION OF EMBODIMENTS

Figure 1:
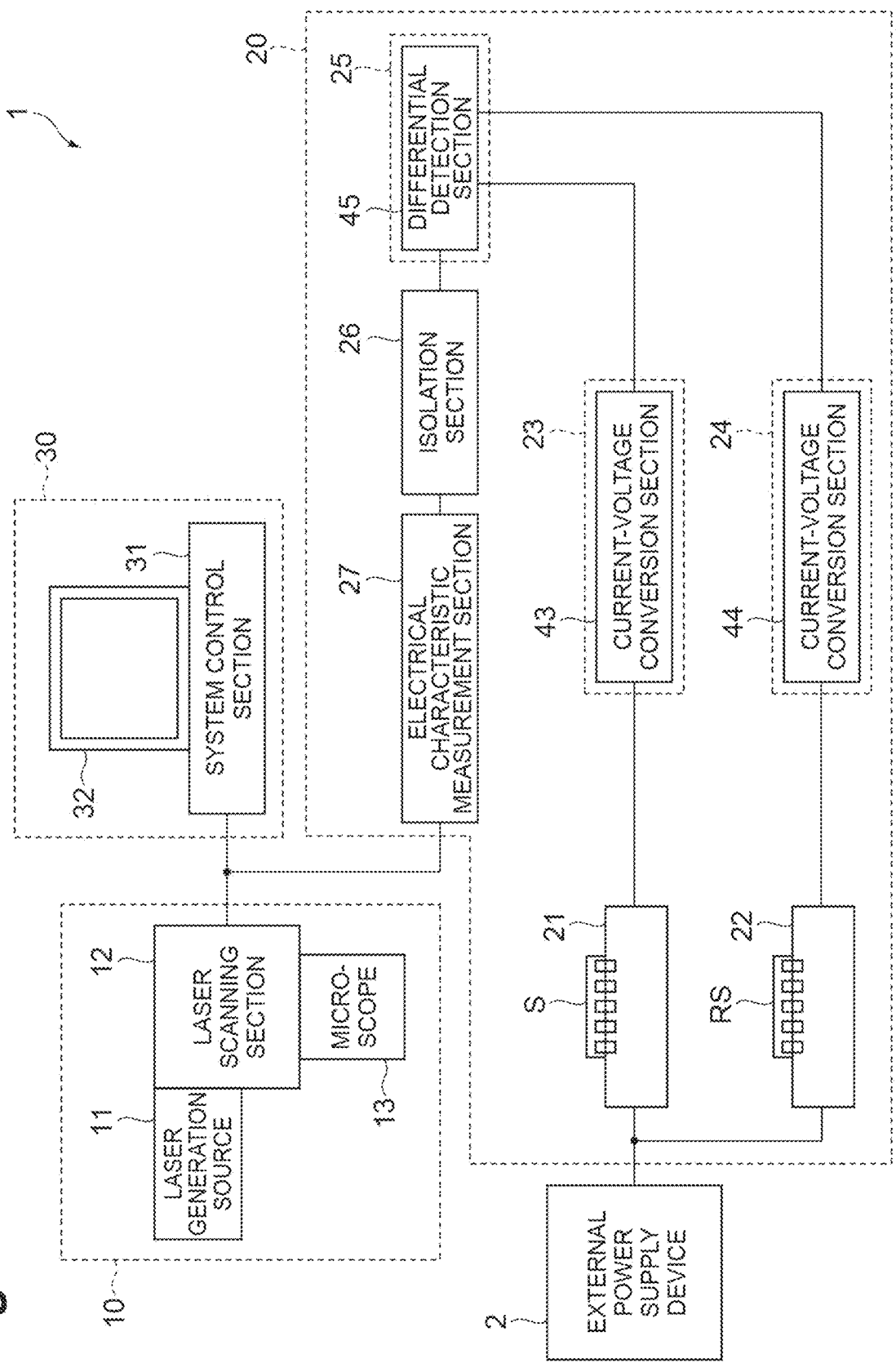
FIG. 1 is a schematic block diagram illustrating the configuration of an inspection device for a semiconductor sample according to the present embodiment.

Hereinafter, embodiments of the present invention will be described in detail with reference to the accompanying diagrams. In addition, in the description, the same elements or elements having the same function are denoted by the same reference numerals, and repeated description thereof will be omitted.

First, the configuration of an inspection device for a semiconductor sample according to the present embodiment will be described with reference to FIGS. 1 and 2. FIG. 1 is a schematic block diagram of an inspection device for a semiconductor sample according to the present embodiment.

An inspection device for a semiconductor sample 1 (hereinafter, simply referred to as an "inspection device") is a device for inspecting a defective portion of a semiconductor sample S, which is a subject, using the OBIRCH method. The semiconductor sample S is, for example, a semiconductor member, such as a semiconductor integrated circuit. In the inspection device 1, a voltage is applied to the semiconductor sample S by an external power supply device 2, and a defective portion of the semiconductor sample S is inspected based on a current signal that is output from the semiconductor sample S in response to the application of the voltage and the irradiation of light. The current signal is output by applying a voltage to the semiconductor sample S. The value of the current signal changes in response to the light irradiation to the semiconductor sample S. The external power supply device 2 is, for example, a switching power supply. The inspection device 1 includes a light irradiation unit 10, an electrical characteristic measurement unit 20, and a control unit 30.

The light irradiation unit 10 irradiates and scans the semiconductor sample S, to which a voltage is being applied by the external power supply device 2, with light (for example, a laser beam L). In the present embodiment, an example will be described in which the laser beam L is used as light applied to the semiconductor sample S. However, the light applied to the semiconductor sample S does not necessarily have to be coherent light, and may be, for example, incoherent light.

The electrical characteristic measurement unit 20 measures the electrical characteristic of the semiconductor sample S based on the current signal output from the semiconductor sample S to which a voltage is being applied by the external power supply device 2 and which is being irradiated with light. The control unit 30 controls the light irradiation unit 10 and the electrical characteristic measurement unit 20. The control unit 30 outputs the inspection result of the semiconductor sample S based on the measured electrical characteristic. The control unit 30 outputs an inspection result indicating a defective portion of the semiconductor sample S according to a change in the electrical characteristic of the semiconductor sample S in response to light irradiation and scanning. In this manner, the inspection device 1 realizes the inspection of the defective portion of the semiconductor sample S.

The light irradiation unit 10 includes a laser generation source 11, a laser scanning section 12, and a microscope 13. The laser generation source 11 is, for example, a semiconductor laser or a solid state laser. When irradiating the semiconductor sample S with incoherent light, a super luminescent diode (SLD) or an ASE light source may be used as the laser generation source 11. The laser generation source 11 generates and emits laser light. The laser scanning section 12 is disposed on the optical path of the laser light emitted from the laser generation source 11. The laser light emitted from the laser generation source 11 is incident on the laser scanning section 12. The laser scanning section 12 emits laser light incident through the microscope 13, as the laser beam L, in a predetermined direction and scans the laser light. For example, the laser scanning section 12 performs a raster scan in a two-dimensional direction perpendicular to the incidence direction. The microscope 13 focuses the emitted laser beam L on a fine spot diameter. The microscope 13 acquires an image of the subject using the reflected light of the emitted laser beam L.

The electrical characteristic measurement unit 20 includes sample tables 21 and 22, a test signal output section 23, a reference signal output section 24, a noise removal section 25, an isolation section 26, and an electrical characteristic measurement section 27. The semiconductor sample S is placed on the sample table 21. The semiconductor sample S placed on the sample table 21 is positioned at the focal position of the microscope 13. A reference member RS is placed on the sample table 22. The reference member RS is, for example, a semiconductor member such as a semiconductor integrated circuit. The reference member RS has the same electrical characteristic as the semiconductor sample S. For example, the reference member RS has an impedance of ±30% with respect to the impedance of the semiconductor sample S. The reference member RS can be replaced with a reference member having different electrical characteristic.

Each of the sample table 21 and the sample table 22 has an input terminal and an output terminal. The input terminals of the sample table 21 and the sample table 22 are connected to the output terminal of the external power supply device 2 in electrical parallel with each other. As illustrated in FIG. 2, the semiconductor sample S placed on the sample table 21 is electrically connected to the output terminal of the external power supply device 2 through the sample table 21. The light irradiation unit 10 irradiates and scans the semiconductor sample S with the laser beam L. The semiconductor sample S outputs a current signal based on the electrical characteristic change of the semiconductor sample S due to irradiation and scanning with the laser beam L and on the output of the external power supply device 2.

Figure 2:
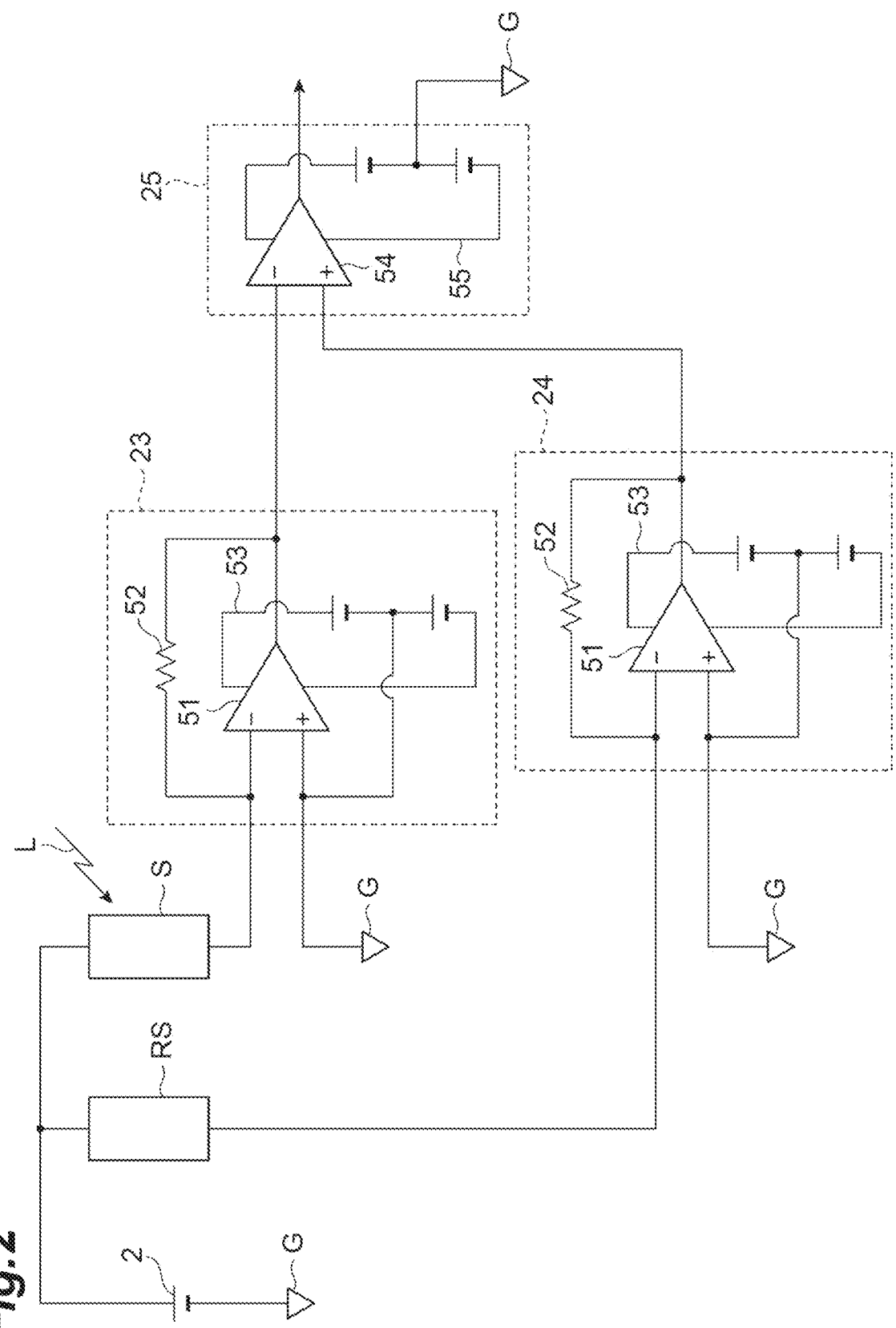
FIG. 2 is a schematic diagram for describing the measurement of electrical characteristic by the inspection device.

As illustrated in FIG. 2, the reference member RS placed on the sample table 22 is connected to the output terminal of the external power supply device 2 through the sample table 22. That is, the reference member RS is connected to the external power supply device 2 in electrical parallel with the semiconductor sample S. Since no laser beam is applied to the reference member RS, the electrical characteristic change in response to laser beam irradiation and scanning does not occur. The reference member RS outputs a current signal based on the output of the external power supply device 2.

The test signal output section 23 is connected in electrical series to the output terminal of the sample table 21. That is, the test signal output section 23 is connected in series to the external power supply device 2 through the sample table 21 and the semiconductor sample S. The test signal output section 23 outputs a test signal based on the current signal output from the semiconductor sample S. The test signal output section 23 has a current-voltage conversion section 43. The current signal input to the test signal output section 23 is converted into a voltage signal by the current-voltage conversion section 43. Therefore, the test signal is a voltage signal.

The reference signal output section 24 is connected in electrical series to the output terminal of the sample table 22. That is, the reference signal output section 24 is connected in electrical series to the reference member RS and the external power supply device 2. The reference signal output section 24 is connected to the external power supply device 2 in electrical parallel with the semiconductor sample S and the sample table 22. The reference signal output section 24 outputs a reference signal based on the current signal output from the reference member RS in response to application of a voltage from the external power supply device 2. Since no laser beam is applied to the reference member RS, the electrical characteristic change in response to laser beam irradiation and scanning does not occur. Therefore, the reference signal is a signal according to the output of the external power supply device 2. The reference signal output section 24 has a current-voltage conversion section 44. The current-voltage conversion section 44 converts the current signal input to the reference signal output section 24 into a voltage signal. Therefore, the reference signal is a voltage signal.

As illustrated in FIG. 2, the test signal output section 23 and the reference signal output section 24 in the present embodiment are negative feedback circuits each having an operational amplifier 51, a resistor 52, and a floating circuit 53. The floating circuit 53 is connected to a ground G of the external power supply device 2 to form a floating power supply. The operational amplifier 51 of each of the test signal output section 23 and the reference signal output section 24 operates with electric power supplied from the floating circuit 53.

In the present embodiment, the ground G of the external power supply device 2 and the semiconductor sample S are connected to the input terminal of the operational amplifier 51 of the test signal output section 23. Therefore, the test signal output section 23 forms an inverting amplifier circuit having an amplification factor that changes according to the impedance change of the semiconductor sample S. The ground G of the external power supply device 2 and the reference member RS are connected to the input terminal of the operational amplifier 51 of the reference signal output section 24. Therefore, the reference signal output section 24 forms an inverting amplifier circuit having an amplification factor based on the impedance of the reference member RS and the resistance value of the resistor 52.

The noise removal section 25 is electrically connected to the test signal output section 23 and the reference signal output section 24. The test signal and the reference signal are input to the noise removal section 25. The noise removal section 25 outputs, based on the reference signal, a noise removal signal obtained by removing the noise component of the output of the external power supply device 2 from the current signal output from the semiconductor sample S. The noise removal section 25 has a differential detection section 45. The differential detection section 45 outputs a signal that is a difference between the reference signal and the test signal input to the noise removal section 25. The noise removal section 25 outputs as a noise removal signal the signal indicating the difference between the test signal and the reference signal.

As illustrated in FIG. 2, the differential detection section 45 includes, for example, a comparison devise 54 such as a comparator or an operational amplifier, and a floating circuit 55. The floating circuit 55 is connected to the ground G of the external power supply device 2 to form a floating power supply. The comparison devise 54 operates with electric power supplied from the floating circuit 55. The test signal output section 23 and the reference signal output section 24 are connected to the input terminal of the comparison devise 54. Therefore, the difference between the test signal and the reference signal is output from the comparison devise 54.

The isolation section 26 connects the noise removal section 25 and the electrical characteristic measurement section 27 to each other in an electrical insulation state. The noise removal section 25 and the electrical characteristic measurement section 27 are connected to each other through the isolation section 26. The isolation section 26 converts the signal output from the noise removal section 25 into a non-electric signal, converts the non-electric signal into an electric signal again, and outputs the signal to the electrical characteristic measurement section 27. The isolation section 26 includes, for example, a transformer, a photocoupler, or a relay. The relay includes, for example, an electromagnetic switch and the like. When the isolation section 26 includes, for example, a transformer, the isolation section 26 magnetically connects the noise removal section 25 and the electrical characteristic measurement section 27 to each other. When the isolation section 26 includes, for example, a photocoupler, the isolation section 26 optically connects the noise removal section 25 and the electrical characteristic measurement section 27 to each other.

The electrical characteristic measurement section 27 measures the electrical characteristic of the semiconductor sample S, which change in response to the irradiation and scanning with the laser beam L, based on the noise removal signal transmitted from the noise removal section 25 through the isolation section 26. In the present embodiment, the electrical characteristic measurement section 27 calculates a value indicating the impedance of the semiconductor sample S, as the electrical characteristic of the semiconductor sample S, from the noise removal signal at predetermined time intervals. The electrical characteristic measurement section 27 sequentially transmits the calculated electrical characteristic (measurement results) to the control unit 30.

The control unit 30 includes a system control section 31 and a display section 32. The system control section 31 is connected to the laser scanning section 12, the microscope 13, the electrical characteristic measurement section 27, and the display section 32. The system control section 31 controls scanning of the laser beam L by the laser scanning section 12, acquisition of an image of the semiconductor sample S by the microscope 13, operation of the electrical characteristic measurement section 27, and display of the measurement result by the display section 32. The system control section 31 displays the state of the semiconductor sample S on the display section 32 based on the measurement result output from the electrical characteristic measurement section 27. The display section 32 is, for example, a display such as a liquid crystal monitor. Physically, the system control section 31 includes: a computer including a central processing unit (CPU) that is a processor, a random access memory (RAM) and a read only memory (ROM) that are recording media, and a communication module; and an input/output device, such as a mouse and a keyboard. The system control section 31 may include a plurality of computers.

Next, the operation of the inspection device 1 will be described in detail. In the inspection device 1, the system control section 31 causes the light irradiation unit 10 to irradiate a fine portion of the surface of the semiconductor sample S with the laser beam L to scan the surface of the semiconductor sample S with the laser beam L.

A predetermined voltage is applied from the external power supply device 2 to the semiconductor sample S, and a predetermined current flows in the circuit of the semiconductor sample S. At a portion of the semiconductor sample S to which the laser beam L is applied, the temperature of the portion rises due to the absorption of the energy of the laser beam L, and the impedance changes. For this reason, the value of the current flowing through the semiconductor sample S changes. At a portion where there is a defect such as a void, heat conduction is poor, so that it is difficult for heat to escape to the surroundings. Therefore, in such a defective portion, a temperature rise is large when being irradiated with the laser beam L. As a result, at the defective portion of the semiconductor sample S to which a predetermined voltage is being applied, an impedance change increases with a temperature rise, and the change in the current value is also large.

The current signal output from the semiconductor sample S is converted into a voltage signal and amplified by the test signal output section 23, and the amplified voltage signal is input to the noise removal section 25 as a test signal. The current signal output from the reference member RS is converted into a voltage signal and amplified by the reference signal output section 24, and the amplified voltage signal is input to the noise removal section 25 as a reference signal.

The noise removal section 25 amplifies and outputs a signal that is a difference between the input test signal and the reference signal. The noise removal signal output from the noise removal section 25 is input to the electrical characteristic measurement section 27 through the isolation section 26.

The electrical characteristic measurement section 27 measures the electrical characteristic of the semiconductor sample S at predetermined time intervals based on the input noise removal signal, and sequentially transmits the measurement results to the system control section 31. The system control section 31 converts the measurement result of the electrical characteristic of the semiconductor sample S into brightness information based on the measurement results transmitted from the electrical characteristic measurement section 27. The system control section 31 associates the irradiation position of the laser beam L with brightness information corresponding to the irradiation position. The system control section 31 generates an image showing a defective portion of the semiconductor sample S based on the irradiation position of the laser beam L and the brightness information, and displays the image on the display section 32. That is, the system control section 31 outputs the defective portion of the semiconductor sample S based on the measurement results transmitted from the electrical characteristic measurement section 27. Therefore, checking of the defective portion of the semiconductor sample S using the image is realized. In the present embodiment, the system control section 31 generates an image based on the measurement results of the electrical characteristic acquired while irradiating and scanning the entire measurement region on the surface of the semiconductor sample S with the laser beam L, and displays the image on the display section 32.

Figure 3:
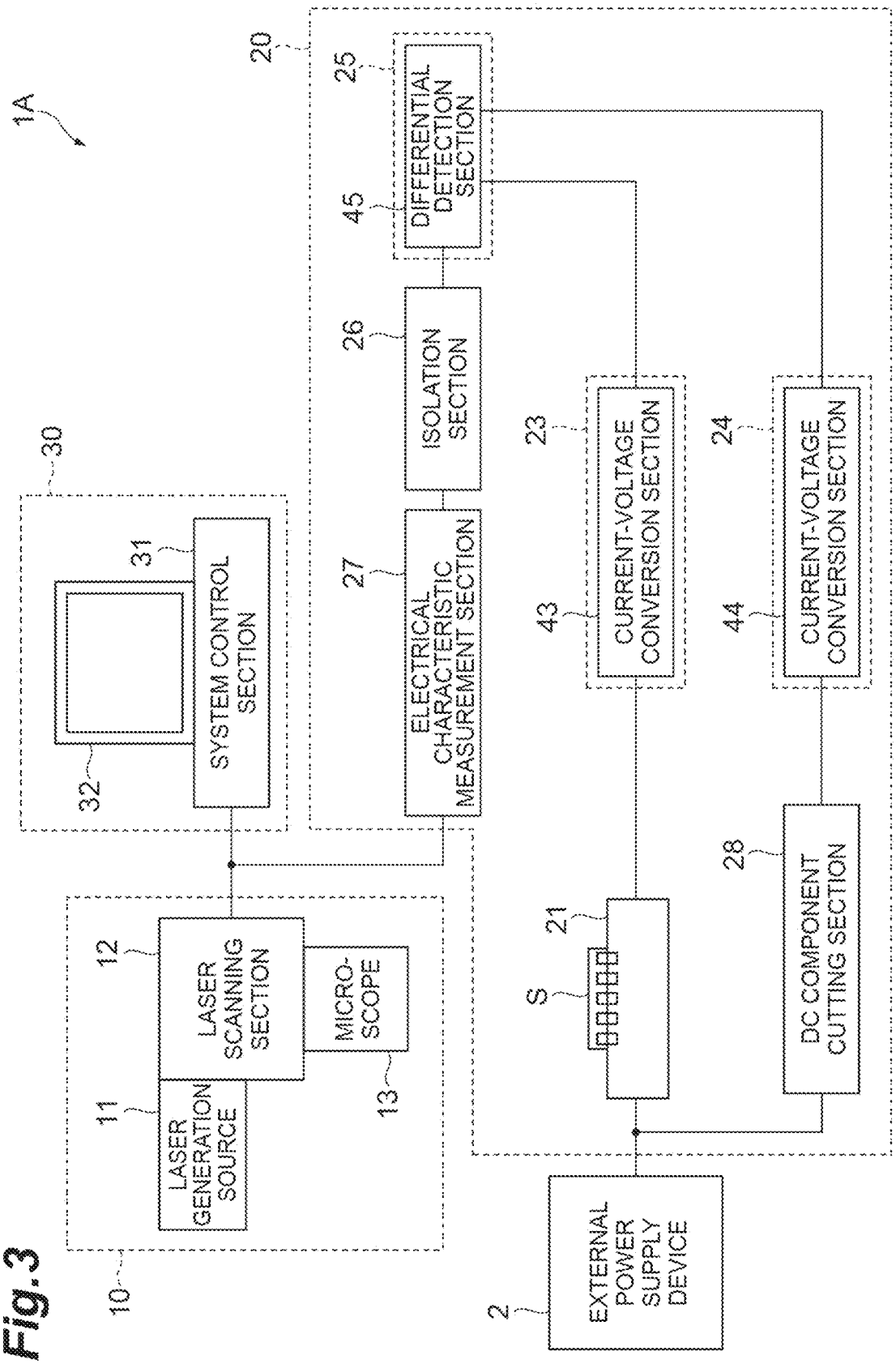
FIG. 3 is a schematic block diagram illustrating the configuration of an inspection device for a semiconductor sample according to a modification example of the present embodiment.
Figure 4:
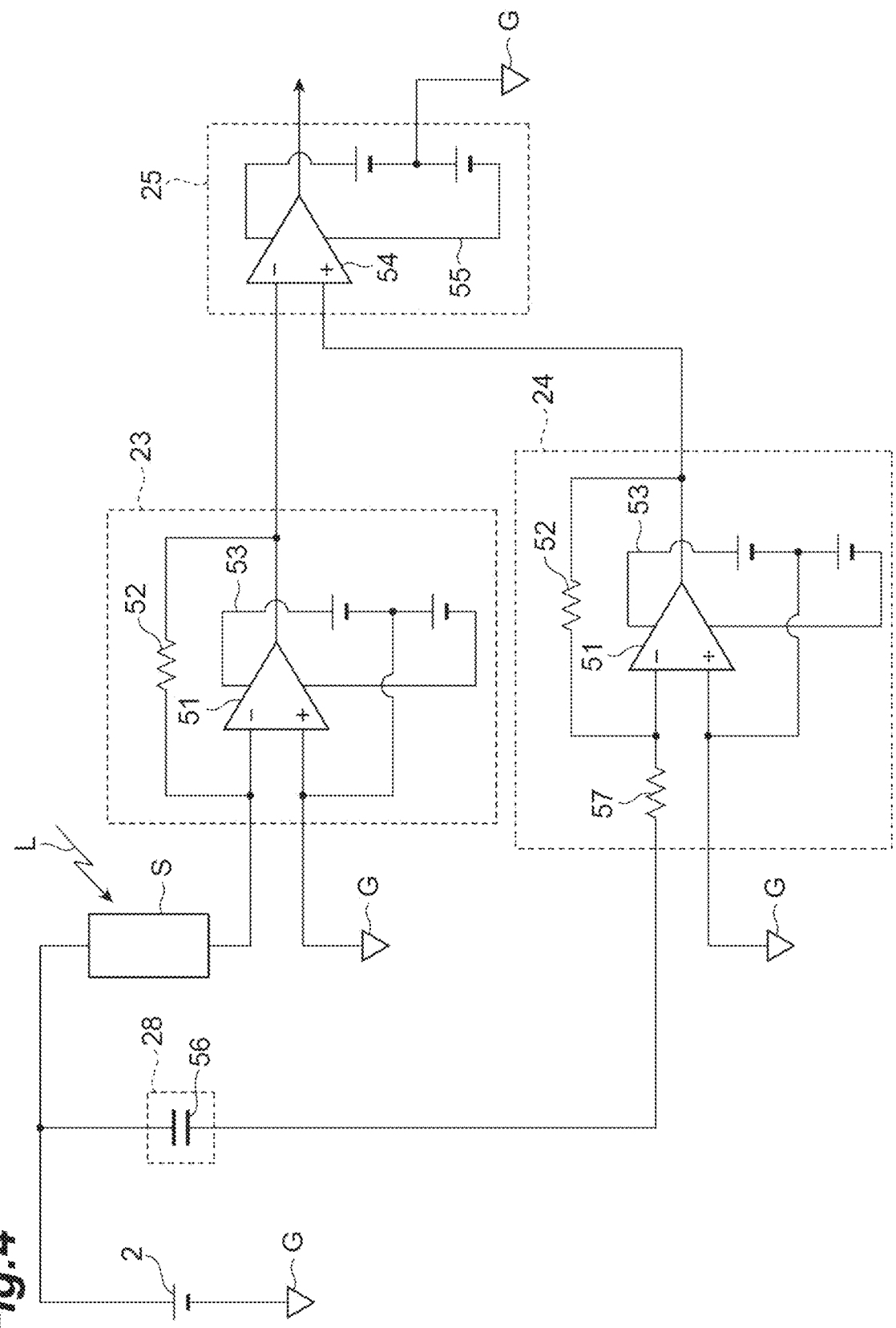
FIG. 4 is a schematic diagram for describing the measurement of electrical characteristic by the inspection device.

Next, an inspection device 1A for a semiconductor sample according to a modification example of the present embodiment will be described with reference to FIGS. 3 and 4. FIG. 3 is a schematic block diagram of an inspection device for a semiconductor sample according to a modification example of the present embodiment. FIG. 4 is a schematic diagram illustrating a part of the inspection device. The modification example illustrated in FIGS. 3 and 4 is different from the above-described embodiment in that a DC component cutting section is provided instead of the sample table 22 and the reference member RS. Hereinafter, the differences between the above-described embodiment and the modification examples will be mainly described.

The electrical characteristic measurement unit 20 of the inspection device 1A includes a sample table 21, a test signal output section 23, a reference signal output section 24, a noise removal section 25, an isolation section 26, an electrical characteristic measurement section 27, and a DC component cutting section 28. The input of the DC component cutting section 28 is connected to the output terminal of the external power supply device 2 in electrical parallel with the sample table 21. The output of the DC component cutting section 28 is connected to the reference signal output section 24. That is, the reference signal output section 24 is connected in series to the external power supply device 2 with the DC component cutting section 28 interposed therebetween.

The DC component cutting section 28 outputs a signal obtained by removing a DC current component from the current signal output from the external power supply device 2. The reference signal output section 24 outputs a reference signal based on the signal output from the DC component cutting section 28. The reference signal output section 24 outputs as a reference signal the signal obtained by removing the DC current component from the current signal output from the external power supply device 2. The signal input to the reference signal output section 24 is converted into a voltage signal by the current-voltage conversion section 44. Therefore, the reference signal is a voltage signal.

As illustrated in FIG. 4, the DC component cutting section 28 in the present embodiment has a capacitor 56. The capacitor 56 is connected to the output terminal of the external power supply device 2 in electrical parallel with the semiconductor sample S. The capacitor 56 is connected in electrical series to the reference signal output section 24. The reference signal output section 24 in this modification example has a resistor 57 in addition to the operational amplifier 51, the resistor 52, and the floating circuit 53, and these form an inverting amplifier circuit.

In the inspection device 1A, the signal obtained by removing the DC current component from the current signal output from the external power supply device 2 by the DC component cutting section 28 is input to the reference signal output section 24. In other words, an AC component of the current signal output from the external power supply device 2, that is, a noise component is input to the reference signal output section 24. Therefore, the reference signal output from the reference signal output section 24 is a signal indicating normal noise.

The current signal output from the semiconductor sample S is converted into a voltage signal and amplified by the test signal output section 23, and the amplified voltage signal is input to the noise removal section 25 as a test signal. The current signal output from the DC component cutting section 28 is converted into a voltage signal and amplified by the reference signal output section 24, and the amplified voltage signal is input to the noise removal section 25 as a reference signal. The noise removal section 25 amplifies and outputs a signal that is a difference between the input test signal and the reference signal.

Figure 5:
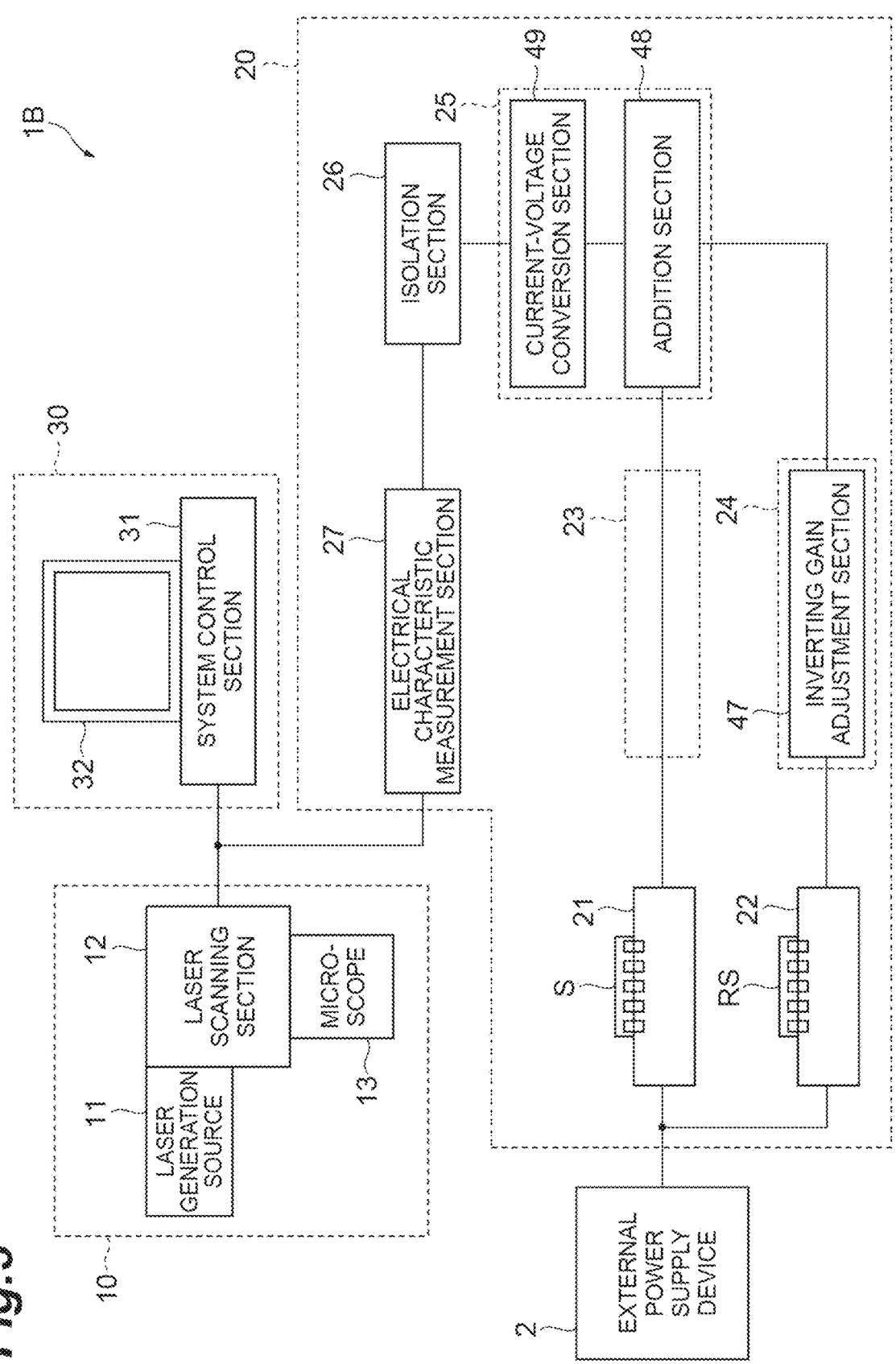
FIG. 5 is a schematic block diagram illustrating the configuration of an inspection device for a semiconductor sample according to a modification example of the present embodiment.
Figure 6:
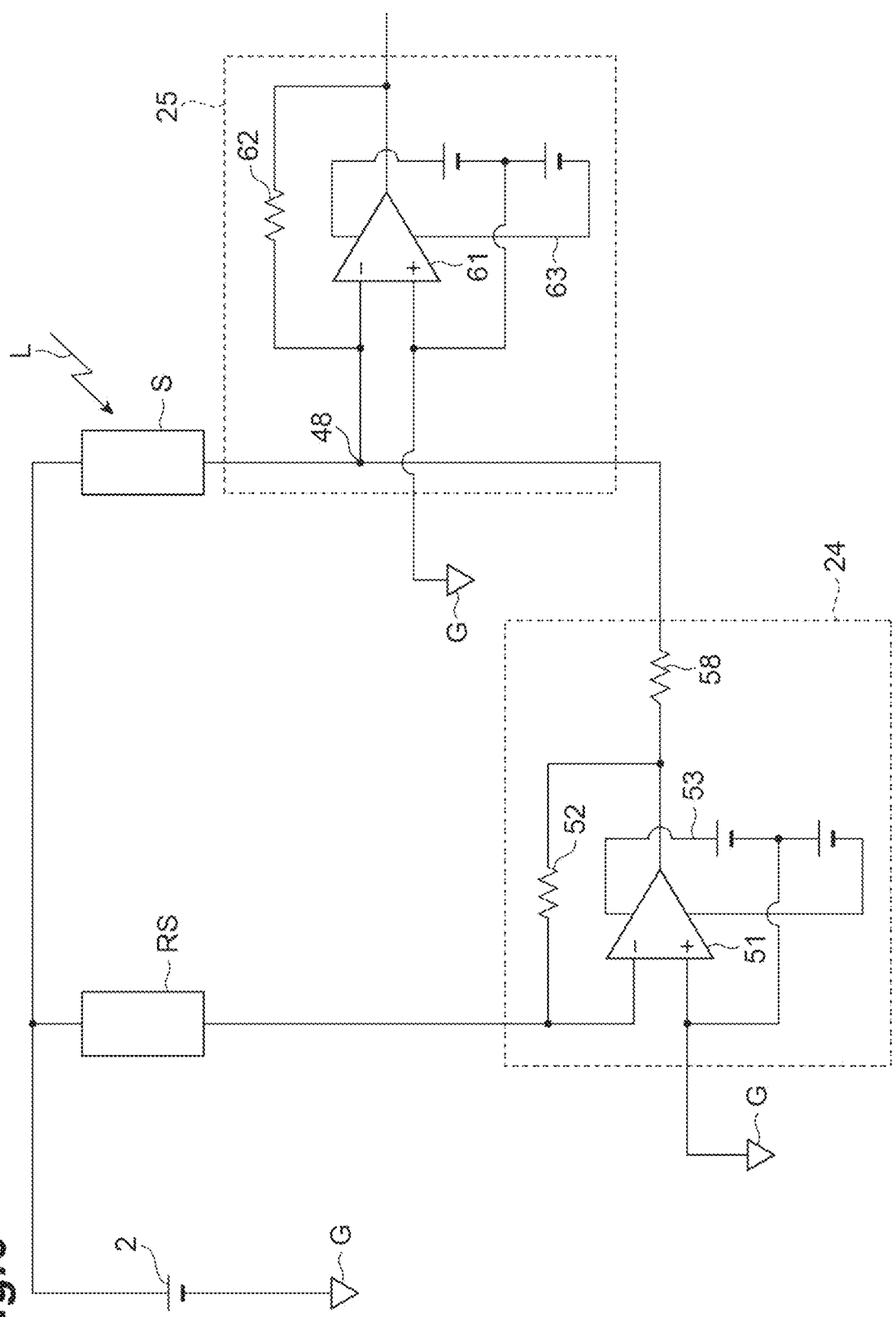
FIG. 6 is a schematic diagram for describing the measurement of electrical characteristic by the inspection device.

Next, an inspection device 1B for a semiconductor sample according to a modification example of the present embodiment will be described with reference to FIGS. 5 and 6. FIG. 5 is a schematic block diagram of an inspection device for a semiconductor sample according to a modification example of the present embodiment. FIG. 6 is a schematic diagram illustrating a part of the inspection device. The modification example illustrated in FIGS. 5 and 6 is different from the above-described embodiment in that a current-voltage conversion section is not provided before the noise removal section and the noise removal section does not have a differential detection section and adds the reference signal and the detection signal. Hereinafter, the differences from the above-described embodiment will be mainly described.

In the inspection device 1B, the test signal output section 23 includes only a wiring that connects the output terminal of the sample table 21 and the noise removal section 25 in electrical series to each other. That is, the test signal output section 23 inputs a current signal output from the semiconductor sample S to the noise removal section 25 as a test signal. Therefore, the test signal is a current signal.

The reference signal output section 24 has an inverting gain adjustment section 47. The inverting gain adjustment section 47 converts the current signal input to the reference signal output section 24, that is, a current signal according to the output of the external power supply device, so as to indicate an opposite phase, and outputs a reference signal whose gain has been adjusted according to the gain of the test signal. Therefore, the reference signal is a current signal indicating a phase opposite to that of the current signal output from the reference member RS.

As illustrated in FIG. 6, the reference signal output section 24 in this modification example is a negative feedback circuit having a resistor 58 in addition to the operational amplifier 51, the resistor 52, and the floating circuit 53. The floating circuit 53 is connected to the ground G of the external power supply device 2 to form a floating power supply. The operational amplifier 51 of the reference signal output section 24 operates with electric power supplied from the floating circuit 53.

The ground G of the external power supply device 2 and the reference member RS are connected to the input terminal of the operational amplifier 51 of the reference signal output section 24. Therefore, the reference signal output section 24 forms an inverting amplifier circuit having an amplification factor based on the impedance of the reference member RS and the resistance value of the resistor 52. The resistor 58 adjusts the gain of the reference signal output from the reference signal output section 24.

The noise removal section 25 has an addition section 48 and a current-voltage conversion section 49 (amplification section). The addition section 48 adds the test signal and the reference signal, and outputs a signal obtained as a result of the addition to the current-voltage conversion section 49. In this modification example, as illustrated in FIG. 6, the addition section 48 is a connector for making a connection among the wiring (test signal output section 23) connected to the output terminal of the sample table 21, the wiring connected to the reference signal output section 24, and the current-voltage conversion section 49. That is, the addition section 48 outputs a current signal having a current value obtained by adding the current value of the test signal and the current value of the reference signal. The current-voltage conversion section 49 converts the current signal output from the addition section 48 into a voltage signal and amplifies the voltage signal. Therefore, the noise removal signal output from the noise removal section 25 is a voltage signal.

As illustrated in FIG. 6, the current-voltage conversion section 49 in this modification example is a negative feedback circuit having an operational amplifier 61, a resistor 62, and a floating circuit 63. The floating circuit 63 is connected to the ground G of the external power supply device 2 to form a floating power supply. The operational amplifier 61 operates with electric power supplied from the floating circuit 63. The ground G of the external power supply device 2 and the addition section 48 are connected to the input terminal of the operational amplifier 61. Therefore, the current-voltage conversion section 49 forms an inverting amplifier circuit.

In the inspection device 1B, the current signal output from the semiconductor sample S is input to the noise removal section 25 as a test signal. The current signal output from the reference member RS is converted into a current signal indicating an opposite phase by the reference signal output section 24, and the current signal indicating an opposite phase is input to the noise removal section 25 as a reference signal. In the noise removal section 25, the test signal and the reference signal are added by the addition section 48, and the signal obtained as a result of the addition is converted into a voltage signal and amplified by the current-voltage conversion section 49.

Figure 7:
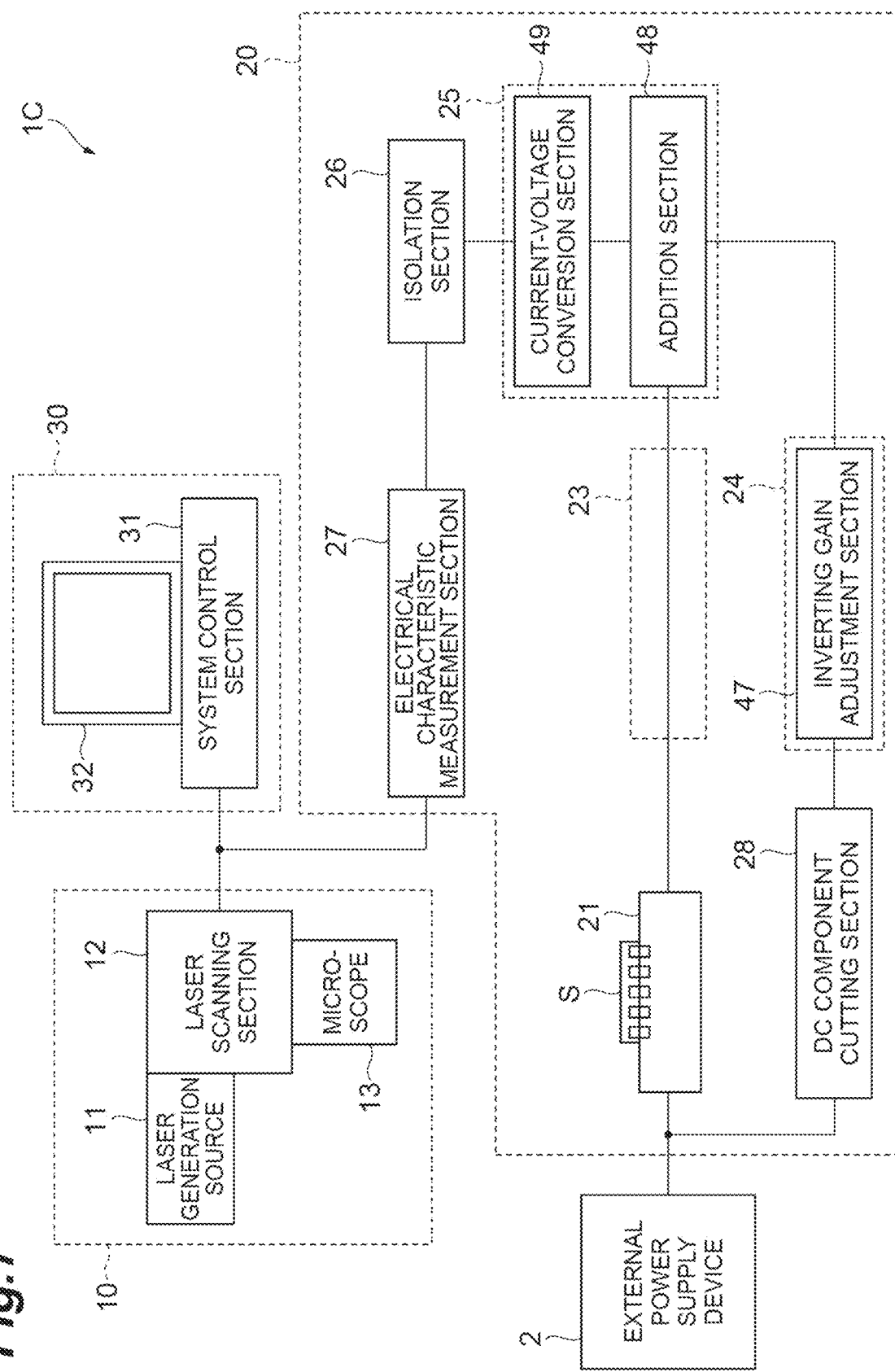
FIG. 7 is a schematic block diagram illustrating the configuration of an inspection device for a semiconductor sample according to a modification example of the present embodiment.
Figure 8:
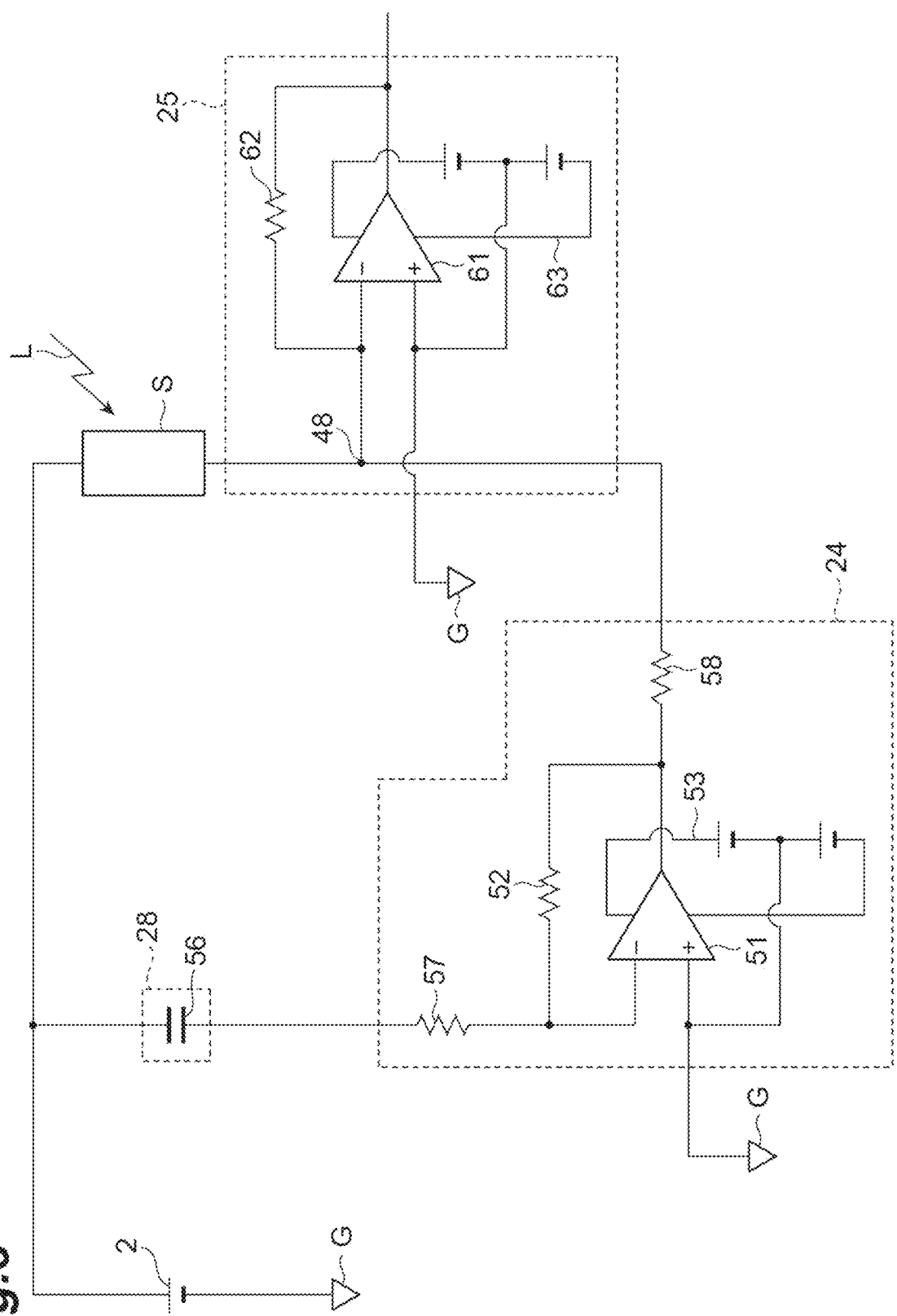
FIG. 8 is a schematic diagram for describing the measurement of electrical characteristic by the inspection device.

Next, an inspection device 1C for a semiconductor sample according to a modification example of the present embodiment will be described with reference to FIGS. 7 and 8. FIG. 7 is a schematic block diagram of an inspection device for a semiconductor sample according to a modification example of the present embodiment. FIG. 8 is a schematic view illustrating a part of the inspection device. The modification example illustrated in FIGS. 7 and 8 is different from the modification example illustrated in FIGS. 5 and 6 in that a DC component cutting section 28 is provided instead of the sample table 22 and the reference member RS. Hereinafter, the differences from the modification example illustrated in FIGS. 5 and 6 will be mainly described.

In the inspection device 1C, the electrical characteristic measurement unit 20 includes a sample table 21, a test signal output section 23, a reference signal output section 24, a noise removal section 25, an isolation section 26, an electrical characteristic measurement section 27, and a DC component cutting section 28. The input of the DC component cutting section 28 is connected to the output terminal of the external power supply device 2 in electrical parallel with the sample table 21. The output of the DC component cutting section 28 is connected to the reference signal output section 24. That is, the reference signal output section 24 is connected in series to the external power supply device 2 through the DC component cutting section 28.

The DC component cutting section 28 outputs a signal obtained by removing a DC current component from the current signal output from the external power supply device 2. The reference signal output section 24 outputs a reference signal based on the signal output from the DC component cutting section 28. The signal input to the reference signal output section 24 is converted into a voltage signal by the current-voltage conversion section 44. Therefore, the reference signal is a voltage signal.

As illustrated in FIG. 8, the DC component cutting section 28 in the present embodiment has a capacitor 56. The capacitor 56 is connected to the output terminal of the external power supply device 2 in electrical parallel with the semiconductor sample S. The capacitor 56 is connected in electrical series to the reference signal output section 24. The reference signal output section 24 in this modification example has resistors 57 and 58 in addition to the operational amplifier 51, the resistor 52, and the floating circuit 53, and these form an inverting amplifier circuit.

In the inspection device 1C, the signal obtained by removing the DC current component from the current signal output from the external power supply device 2 by the DC component cutting section 28 is input to the reference signal output section 24. In other words, an AC component of the current signal output from the external power supply device 2 is input to the reference signal output section 24. The AC component corresponds to a noise component. Therefore, the reference signal output from the reference signal output section 24 is a signal indicating normal noise.

The current signal output from the semiconductor sample S is input to the noise removal section 25 as a test signal. The current signal output from the DC component cutting section 28 is converted into a current signal indicating an opposite phase by the reference signal output section 24, and the current signal indicating an opposite phase is input to the noise removal section 25 as a reference signal. In the noise removal section 25, the test signal and the reference signal are added by the addition section 48, and the signal obtained as a result of the addition is converted into a voltage signal and the voltage signal is amplified and output by the current-voltage conversion section 49.

Figure 9:
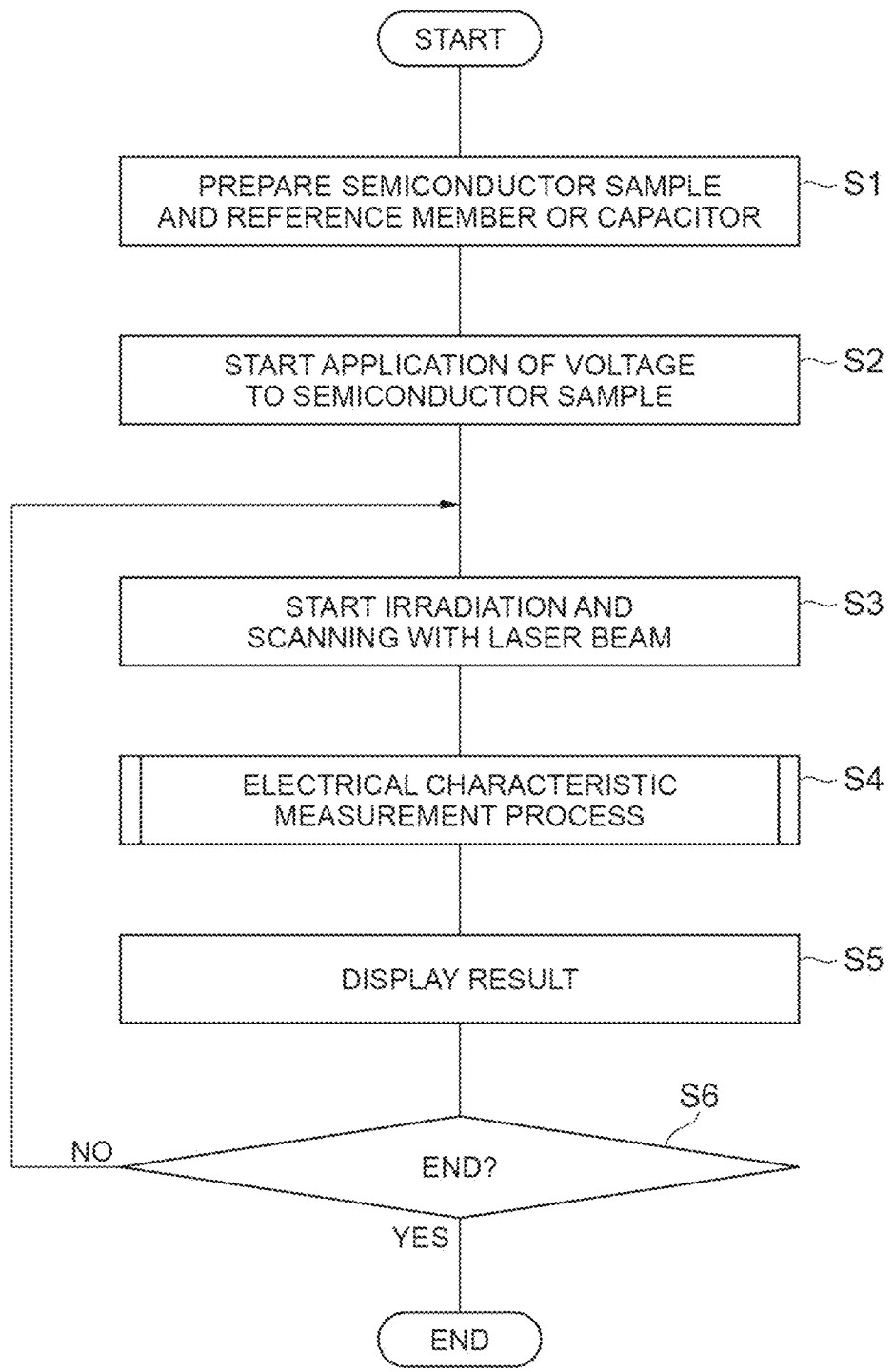
FIG. 9 is a flowchart illustrating an inspection method for a semiconductor sample.
Figure 10:
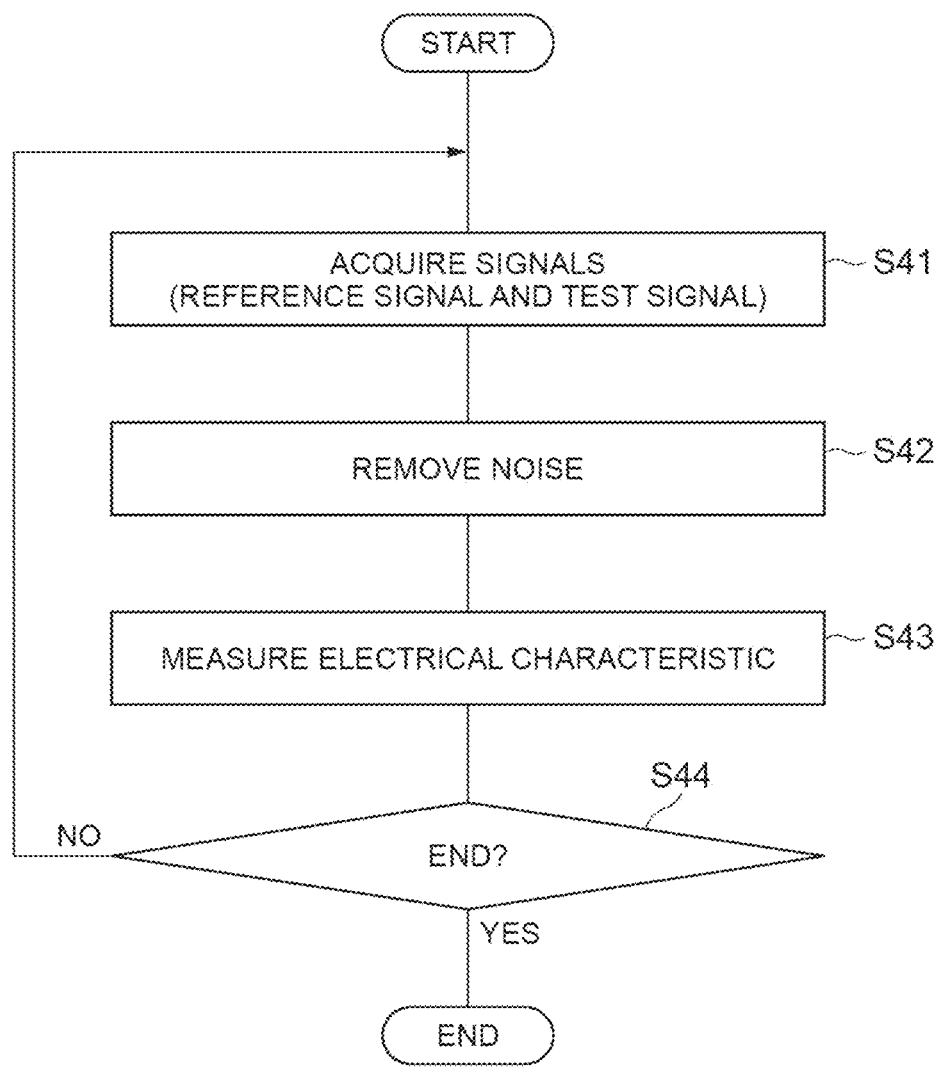
FIG. 10 is a flowchart illustrating an inspection method for a semiconductor sample.

Next, a method of inspecting the semiconductor sample S using the inspection devices 1, 1A, 1B, and 1C according to the present embodiment and the modification examples will be described with reference to FIGS. 9 and 10. FIG. 9 is a flowchart illustrating an inspection method for a semiconductor sample. FIG. 10 is a flowchart illustrating the details of an electrical characteristic measurement process in the process illustrated in FIG. 9.

First, the semiconductor sample S and the reference member RS or the capacitor 56 are prepared (step S1). The semiconductor sample S is placed on the sample table 21 and connected to the external power supply device 2. When the inspection devices 1 and 1B are used, the reference member RS is placed on the sample table 22, and is connected to the external power supply device 2 in electrical parallel with the semiconductor sample S and connected in electrical series to the reference signal output section 24. When the inspection devices 1A and 1C are used, the capacitor 56 is connected to the external power supply device 2 in electrical parallel with the semiconductor sample S and is connected in electrical series to the reference signal output section 24. The capacitor 56 may be connected to the reference signal output section 24 in advance. When the capacitor 56 is connected to the reference signal output section 24 in advance, the process indicated by step S1 will be omitted.

Then, the application of a voltage to the semiconductor sample S by the external power supply device 2 is started (step S2). At this time, when the inspection devices 1 and 1B are used, the application of a voltage to the reference member RS by the external power supply device 2 is also started. In the present embodiment, the application of a voltage by the external power supply device 2 is continued until all the processes are completed.

Then, the light irradiation unit 10 starts irradiating and scanning the semiconductor sample S with the laser beam L (step S3). In the present embodiment, irradiating and scanning the semiconductor sample S with the laser beam L by the light irradiation unit 10 is continued until irradiating and scanning the entire measurement region of the semiconductor sample S with the laser beam L.

Then, an electrical characteristic measurement process is performed (step S4). In the present embodiment, the measurement results of the electrical characteristic measured by the electrical characteristic measurement unit 20 are sequentially transmitted to the system control section 31.

Then, the system control section 31 displays the measurement results of the electrical characteristic on the display section 32 (step S5). In the present embodiment, the system control section 31 converts the measurement result of the electrical characteristic of the semiconductor sample S corresponding to the irradiation position of the laser beam L into brightness information based on the measurement results transmitted from the electrical characteristic measurement section 27 and the irradiation position of the laser beam L. Then, the system control section 31 associates the irradiation position of the laser beam L with brightness information corresponding to the irradiation position. Then, the system control section 31 generates an image showing a defective portion of the semiconductor sample S based on the irradiation position of the laser beam L and the brightness information, and displays the image on the display section 32. That is, the system control section 31 outputs the defective portion of the semiconductor sample S based on the measurement result transmitted from the electrical characteristic measurement section 27.

Then, the system control section 31 determines whether or not to end all the processes (step S6). When it is determined that all the processes are not to be ended (NO in step S6), the process returns to step S3 to start irradiation and scanning with the laser beam L. When it is determined that all the processes are to be ended (YES in step S6), all the processes are ended.

Next, the electrical characteristic measurement process shown in step S4 will be described in more detail.

In the electrical characteristic measurement process, the noise removal section 25 acquires a reference signal and a test signal (step S41). The test signal is a signal based on the current signal output from the semiconductor sample S in response to the application of a voltage from the external power supply device 2. When the inspection devices 1 and 1A are used, the test signal is a signal obtained by converting into a voltage signal the current signal output from the semiconductor sample S in response to the application of a voltage from the external power supply device 2. When the inspection devices 1B and 1C are used, the test signal is the current signal itself output from the semiconductor sample S in response to the application of a voltage from the external power supply device 2.

The reference signal is a signal output from the reference signal output section 24, which is connected to the external power supply device 2 in electrical parallel with the semiconductor sample S, according to the output of the external power supply device 2. When the inspection devices 1 and 1B are used, the reference signal is a signal based on the current signal output from the reference member RS due to the output of the external power supply device 2. When the inspection devices 1A and 1C are used, the reference signal is a signal output from the reference signal output section 24 based on a signal obtained by removing a DC current component from the current signal output from the external power supply device 2. The signal obtained by removing the DC current component from the current signal output from the external power supply device 2 is generated by, for example, the capacitor 56. When the inspection devices 1 and 1A are used, the reference signal is a voltage signal according to the output of the external power supply device 2. When the inspection devices 1B and 1C are used, the reference signal is a signal indicating a phase opposite to that of the current signal output from the reference member RS or the DC component cutting section 28 according to the output of the external power supply device 2.

Then, the noise removal section 25 generates a noise removal signal by removing the noise of the output of the external power supply device 2 from the test signal based on the reference signal (step S42). When the inspection devices 1 and 1A are used, the noise removal section 25 generates a noise removal signal based on the difference between the reference signal and the test signal. When the inspection devices 1B and 1C are used, the noise removal section 25 generates a noise removal signal by adding the reference signal and the test signal and amplifying a signal obtained as a result of the addition.

Then, the electrical characteristic measurement section 27 measures the electrical characteristic of the semiconductor sample S (step S43). The electrical characteristic measurement section 27 measures the electrical characteristic of the semiconductor sample S based on the noise removal signal generated by the noise removal section 25. In the present embodiment, the electrical characteristic measurement section 27 sequentially transmits the measurement results to the system control section 31.

Then, it is determined whether or not to end the electrical characteristic measurement process (step S44). When it is determined that the electrical characteristic measurement process is not to be ended (NO in step S44), the process returns to step S41 to acquire the reference signal and the test signal by the noise removal section 25. When it is determined that the electrical characteristic measurement process is to be ended (YES in step S44), the electrical characteristic measurement process is ended, and the process proceeds to step S5.

As described above, each of the inspection devices 1, 1A, 1B, and 1C according to the present embodiment and the modification examples includes the reference signal output section 24 that is connected to the external power supply device 2 in electrical parallel with the semiconductor sample S and that outputs a reference signal according to the output of the external power supply device 2. The noise removal section 25 outputs a noise removal signal obtained by removing the noise of the output of the external power supply device 2 from the test signal, which indicates a current signal output from the semiconductor sample S in response to application of a voltage from the external power supply device 2, based on the reference signal. The electrical characteristic measurement section 27 measures the electrical characteristic of the semiconductor sample S based on the noise removal signal. Therefore, in the inspection devices 1, 1A, 1B, and 1C, it is possible to both increase the electric power supplied to the semiconductor sample S by using the external power supply device 2 and reduce the influence of noise on the measurement result of the electrical characteristic of the semiconductor sample S. As a result, the inspection accuracy of a defective portion of the semiconductor sample S can be improved.

In the inspection devices 1 and 1B, the reference signal output section 24 is connected in electrical series to the reference member RS that is connected to the external power supply device 2 in electrical parallel with the semiconductor sample S. The reference signal output section 24 outputs, as a reference signal, a signal based on the current signal output from the reference member RS in response to application of a voltage from the external power supply device 2. In this case, the reference signal output from the reference signal output section 24 is based on the current signal from the reference member RS that is connected to the external power supply device 2 in electrical parallel with the semiconductor sample S. Therefore, it is easy to adjust the gain of the reference signal according to the current signal output from the semiconductor sample S.

In the inspection devices 1A and 1C, the reference signal output section 24 outputs as a reference signal a signal obtained by removing a DC current component from the current signal output from the external power supply device 2. In this case, the reference signal output from the reference signal output section 24 is based on a signal obtained by removing the DC current component from the current signal output from the external power supply device 2. The signal obtained by removing the DC current component indicates a noise component of the output of the external power supply device 2. Therefore, it is easy to generate a reference signal including a noise component of the output of the external power supply device 2.

In the inspection devices 1A and 1C, the capacitor 56 is connected to the external power supply device 2 in electrical parallel with the semiconductor sample S. Therefore, all the DC components of the current signal output from the external power supply device 2 are input to the test signal output section 23 through the semiconductor sample S. That is, the current value output from the external power supply device 2 is the current value output from the semiconductor sample S. As a result, the ease of measuring the electrical characteristic is improved.

In the inspection devices 1 and 1B, the test signal output section 23 outputs a test signal obtained by converting the current signal output from the semiconductor sample S into a voltage signal. The reference signal output section 24 outputs, as a reference signal, a signal obtained by converting the current signal from the external power supply device 2 into a voltage signal. The noise removal section 25 outputs as a noise removal signal a signal indicating the difference between the test signal and the reference signal. In this case, in the noise removal signal indicating the difference between the test signal and the reference signal, noise generated when the current signal is converted into the voltage signal is also removed.

In the inspection devices 1A and 1C, the reference signal output section 24 outputs, as a reference signal, a signal indicating a phase opposite to that of the current signal according to the output of the external power supply device 2. The addition section 48 adds a reference signal to the current signal output from the semiconductor sample S. The current-voltage conversion section 49 amplifies the signal obtained by the addition of the addition section 48. In this case, the amplification is performed after adding the reference signal to the current signal output from the semiconductor sample S. That is, amplification is performed after the noise of the output of the external power supply device 2 is removed. Therefore, even when the noise of the output of the external power supply device 2 is large, it is possible to prevent the noise from being removed from the reference signal due to saturation caused by amplification. Therefore, the noise of the output of the external power supply device 2 is removed more accurately.

In the inspection devices 1, 1A, 1B, and 1C, the noise removal section 25 and the electrical characteristic measurement section 27 are electrically insulated from each other by the isolation section 26. The isolation section 26 connects the noise removal section 25 and the electrical characteristic measurement section 27 to each other through, for example, a transformer, a photocoupler, or a relay. In this case, it is possible to prevent common mode noise from being mixed into the electrical characteristic measurement section.

In the inspection devices 1, 1A, 1B, and 1C, at least one of the reference signal output section 24 and the noise removal section 25 operates with electric power supplied from the floating circuit 63 connected to the ground G of the external power supply device 2. In this case, the mixing of common mode noise from the power supply that supplies electric power to the reference signal output section 24 or the noise removal section 25 is suppressed.

While the embodiment and the modification examples of the present invention have been described above, the present invention is not necessarily limited to the embodiment and the modification examples described above, and various changes can be made without departing from the scope of the present invention.

For example, in the present embodiment and the modification examples, the electrical characteristic measurement section 27 and the system control section 31 have been described separately. However, the electrical characteristic measurement section 27 may be included in the system control section 31.

The system control section 31 may display an image on the display section 32 after irradiating and scanning the entire measurement region of the semiconductor sample S or a predetermined part of the measurement region with the laser beam L, or may sequentially display images on the display section 32 according to the reception of the measurement results from the electrical characteristic measurement section 27.

In the present embodiment, the electrical characteristic measurement section 27 sequentially transmits the measurement results to the system control section 31, but may collectively transmit the measurement results to the system control section 31 after irradiating and scanning the entire measurement region of the semiconductor sample S or a predetermined part of the measurement region with the laser beam L.

The process flow described in the present embodiment is for describing an exemplary process order, and the inspection method is not limited to the specific process order described. The process order may be changed as long as there is no contradiction. For example, the order of the start of applying a voltage to the semiconductor sample S by the external power supply device 2 and the start of irradiating and scanning the semiconductor sample S with the laser beam L by the light irradiation unit 10 may be reversed.

REFERENCE SIGNS LIST 1, 1A, 1B, 1C: inspection device, 2: external power supply device, 23: test signal output section, 24: reference signal output section, 25: noise removal section, 26: isolation section, 27: electrical characteristic measurement section, 48: addition section, 49: current-voltage conversion section, 56: capacitor, 63: floating circuit, S: semiconductor sample.

The invention claimed is:

1. An inspection device for a semiconductor sample, comprising:
a reference signal output section connected to an external power supply device in electrical parallel with the semiconductor sample and configured to output a reference signal according to an output of the external power supply device;
a noise removal section configured to output a noise removal signal obtained by, based on the reference signal, removing a noise component of the output of the external power supply device from a current signal, the current signal being output from the semiconductor sample in response to application of a voltage from the external power supply device; and
an electrical characteristic measurement section configured to measure an electrical characteristic of the semiconductor sample based on the noise removal signal,
wherein the inspection device measures the electrical characteristic of the semiconductor sample to which a voltage is being applied by the external power supply device and which is being irradiated and scanned with light, and outputs a defective portion of the semiconductor sample based on the electrical characteristic,
the reference signal output section is connected in electrical series to a reference member connected to the external power supply device in electrical parallel with the semiconductor sample, and is configured to output, as the reference signal, a signal based on a current signal output from the reference member in reference to application of the voltage from the external power supply device, and
the noise removal section is configured so that the reference signal and the current signal are input to the noise removal section.

2. The inspection device according to claim 1,
wherein the reference signal output section is configured to output, as the reference signal, a signal obtained by removing a DC current component from a current signal output from the external power supply device.

3. The inspection device according to claim 2, further comprising:
a capacitor connected to the external power supply device in electrical parallel with the semiconductor sample and connected in electrical series to the reference signal output section.

4. The inspection device according to claim 1, further comprising:
a test signal output section configured to output a test signal obtained by converting the current signal output from the semiconductor sample into a voltage signal,
wherein the reference signal output section is configured to output, as the reference signal, a signal obtained by converting a current signal from the external power supply device into a voltage signal, and
the noise removal section is configured to output, as the noise removal signal, a signal indicating a difference between the test signal and the reference signal.

5. The inspection device according to claim 1,
wherein the reference signal output section is configured to output, as the reference signal, a signal indicating a phase opposite to that of a current signal according to the output of the external power supply device, and
the noise removal section includes an addition section configured to add the reference signal to the current signal output from the semiconductor sample and an amplification section configured to amplify a signal obtained by the addition of the addition section.

6. The inspection device according to claim 1,
wherein the noise removal section and the electrical characteristic measurement section are electrically insulated from each other and are connected to each other through a transformer, a photocoupler, or a relay.

7. The inspection device according to claim 1,
wherein at least one of the reference signal output section and the noise removal section is configured to operate with electric power supplied from a floating circuit connected to a ground of the external power supply device.

8. An inspection method for a semiconductor sample, comprising:
applying a voltage to the semiconductor sample by an external power supply device;
irradiating and scanning with light the semiconductor sample to which a voltage is being applied by the external power supply device;
acquiring a test signal based on a current signal output from the semiconductor sample in response to application of a voltage from the external power supply device;
acquiring a reference signal output according to an output of the external power supply device from a reference signal output section connected to the external power supply device in electrical parallel with the semiconductor sample;
generating a noise removal signal by removing noise of the output of the external power supply device from the test signal based on the reference signal;
measuring an electrical characteristic of the semiconductor sample based on the noise removal signal;
outputting a defective portion of the semiconductor sample based on the electrical characteristic of the semiconductor sample; and
connecting a reference member to the external power supply device in electrical parallel with the semiconductor sample and connecting the reference member in electrical series to the reference signal output section,
wherein the reference signal is a signal based on a current signal output from the reference member in response to application of the voltage from the external power supply device.

9. The inspection method according to claim 8,
wherein the reference signal is a signal output from the reference signal output section based on a signal obtained by removing a DC current component from a current signal output from the external power supply device.

10. The inspection method according to claim 9, further comprising:
connecting a capacitor to the external power supply device in electrical parallel with the semiconductor sample and connecting the capacitor in electrical series to the reference signal output section; and
generating a signal by removing a DC current component from the current signal output from the external power supply device by the capacitor.

11. The inspection method according to claim 8,
wherein the test signal is a voltage signal obtained by converting a current signal output from the semiconductor sample in response to application of a voltage from the external power supply device,
the reference signal is a voltage signal according to the output of the external power supply device, and
the noise removal signal is a signal based on a difference between the test signal and the reference signal.

12. The inspection method according to claim 8, further comprising:
amplifying the noise removal signal,
wherein the test signal is a current signal output from the semiconductor sample in response to application of the voltage from the external power supply device,
the reference signal is a signal indicating a phase opposite to that of a current signal according to the output of the external power supply device, and
the noise removal signal is a signal obtained by adding the test signal and the reference signal.

* * * * *